United States Patent [19]

Kim et al.

[11] Patent Number: 5,792,823
[45] Date of Patent: Aug. 11, 1998

[54] VINYL 4-TETRAHYDROPYRANYLOXYBENZAL-VINYL 4-HYDROXYBENZAL-VINYL TETRAHYDROPYRANYL ETHER-VINYL ACETATE COPOLYMER, VINYL 4-TETRAHYDROPYRANYLOXYBENZAL-VINYL TETRAHYDROPYRANYL ETHER-VINYL ACETATE COPOLYMER AND PREPARATION METHODS THEREOF

[75] Inventors: Jin Baek Kim; Hyun Woo Kim, both of Seoul; Jin Seuk Kim, Taejon, all of Rep. of Korea

[73] Assignees: Hyundai Electronics Industries Co., Ltd.; Korea Advanced Institute of Science and Technology, both of Rep. of Korea

[21] Appl. No.: 814,823

[22] Filed: Mar. 11, 1997

[30] Foreign Application Priority Data

Dec. 20, 1996 [KR] Rep. of Korea .............. 96-68911

[51] Int. Cl.$^6$ .............. C08F 224/00; C08F 218/08; C08F 216/12
[52] U.S. Cl. .............. 526/266; 526/319; 526/334
[58] Field of Search .............. 526/266, 319, 526/334

[56] References Cited

U.S. PATENT DOCUMENTS 4,115,128   9/1978   Kita .
4,491,628   1/1985   Ito et al. .

FOREIGN PATENT DOCUMENTS 0494792   7/1992   European Pat. Off. .

*Primary Examiner*—Joseph L. Schofer
*Assistant Examiner*—Wu C. Cheng
*Attorney, Agent, or Firm*—Gary M. Nath; Nath & Associates

[57] ABSTRACT

A vinyl 4-tetrahydropyranyloxybenzal-vinyl 4-hydroxybenzal-vinyl tetrahydropyranyl ether-vinyl acetate copolymer, a vinyl 4-tetrahydropyranyloxybenzal-vinyl tetrahydropyranyl ether-vinyl acetate copolymer and a preparation method thereof are provided. The copolymers have excellent transparency because they are very low in optical absorbance in the deep uv range. In addition, the acetal structure in the backbone and in the substituted groups endows the photoresist of the copolymer with superior dry etch resistance.

2 Claims, No Drawings

VINYL 4-TETRAHYDROPYRANYLOXYBENZAL-VINYL 4-HYDROXYBENZAL-VINYL TETRAHYDROPYRANYL ETHER-VINYL ACETATE COPOLYMER, VINYL 4-TETRAHYDROPYRANYLOXYBENZAL-VINYL TETRAHYDROPYRANYL ETHER-VINYL ACETATE COPOLYMER AND PREPARATION METHODS THEREOF

BACKGROUND OF THE INVENTION

1. Field of the Invention

The present invention relates to copolymers suitable for photoresists. More particularly, the present invention relates to a vinyl 4-tetrahydropyranyloxybenzal-vinyl 4-hydroxybenzal-vinyl tetrahydropyranyl ether-vinyl acetate copolymer and a vinyl 4-tetrahydropyranyloxybenzal-vinyl tetrahydropyranylether-vinyl acetate copolymer. Also, the present invention is concerned with methods for preparing the copolymers.

2. Description of the Prior Art

The demand for highly integrated semiconductor devices has made a significant advance for microlithography, one of the most essential techniques to achieve the high integration of a microelectronic devices. As a result, a variety of photoresists have now been developed. Among these photoresists, polyvinylphenol resins protected by t-butoxycarbonyl group, that is, poly(4-t-butoxycarbonyloxystyrene) resins, which are disclosed in U.S. Pat. Nos. 4,491,628, 4,405,708 and 4,670,507, are expected to be the most useful and are being used in practice.

In spite of significant advantages, these polyvinylphenol resins, however, are known to show high optical absorbance at around 250 nm due to the benzene rings contained therein. Because deep uv, a light source for the microlithography in current use, has a frequency of around 250 nm, the polyvinylphenol resins have low transparency at the frequency.

Poly(4-t-butoxycarbonyloxystyrene) resins lose much weight upon post-exposure baking in addition to being poor in adhesion. Like polyvinylphenol resins, they show low transparency because of high optical absorbance at around 250 nm. For example, a resin obtained by using 4-t-butoxycarbonyloxy styrene with an average molecular weight of 10,000 as a monomer and 2,2'-azobisisobutyronitrile (AIBN) as an initiator, shows a uv optical absorbance of 0.170 at 250 nm when it is 1 μm thick. For a resin polymerized from the monomer in the presence of benzoylperoxide, its uv optical absorbance is 0.140 μm$^{-1}$. As exemplified above, the resins are both opaque at around 250 nm because of their high optical absorbance.

In order to solve the above problems, novel copolymers, vinyl 4-t-butoxycarbonyloxybenzal-vinyl alcohol-vinyl acetate copolymer and vinyl 4-t-butoxycarbonyloxybenzal-vinyl 4-hydroxybenzal-vinyl alcohol-vinyl acetate copolymer were suggested by the present inventors in Korean Pat. Appl'n No. 95-44162 the content of which is incorporated by reference. Though these novel materials are advantageous in many aspects, they may not be used for high temperature processing due to their relatively low glass transition temperatures.

SUMMARY OF THE INVENTION

Intensive research by the present inventors aiming to develop novel materials with high glass transition temperatures resulted in the finding that the vinyl 4-hydroxybenzal-vinyl alcohol-vinyl acetate copolymers protected by the tetrahydropyranyl group, instead of the t-butoxycarbonyl group, exhibit high thermal stability in addition to being superior in transparency because of low optical absorption at 250 nm. The ring structure of the acetal group introduced endows the copolymer with excellent dry etch resistance, glass transition temperature and adhesion to silicon wafer.

Therefore, it is the first objective of the present invention to provide a vinyl 4-tetrahydropyranyloxybenzal-vinyl 4-hydroxybenzal-vinyl tetrahydropyranyl ether-vinyl acetate copolymer and a vinyl 4-tetrahydropyranyloxybenzal-vinyl tetrahydropyranyl ether-vinyl acetate.

It is the second objective of the present invention to provide methods for preparing the above copolymers.

It is the third objective of the present invention to provide photoresists made of the copolymers.

DETAILED DESCRIPTION OF THE INVENTION

The copolymers of the present invention are prepared from the vinyl 4-hydroxybenzal-vinyl alcohol-vinyl acetate copolymer represented by the following general formula III:

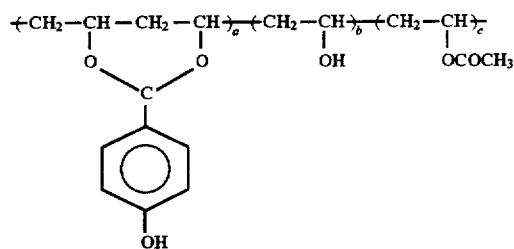

wherein a is a mole percent ranging from 5 to 70;

b is a mole percent ranging from 1 to 60; and c is a mole percent ranging from 0 to 40, by protecting all of the vinyl alcohol groups and all or parts of the vinyl 4- hydroxybenzal groups with tetrahydropyranyl groups.

In more detail, to prepare a novel vinyl 4-tetrahydropyranyloxybenzal-vinyl 4-hydroxybenzal-vinyl tetrahydropyranyl ether-vinyl acetate copolymer or vinyl 4-tetrahydropyranyloxybenzal-vinyl tetrahydropyranyl ether-vinyl acetate copolymer, vinyl 4-hydroxyoxybenzal-vinyl alcohol-vinyl acetate copolymer, which can be synthesized by the method suggested in Korean Pat. Appl'n. No. 95-44162 to the present inventors, is first dissolved in dimethylformamide to give a 3-20 wt % solution. Stirring for 1 hr follows for complete dissolution. Separately, 2,3-dihydroxypyran is dissolved in dimethylformamide to give a 3-20 wt % solution, which is then added with an acid catalyst selected from the group consisting of hydrochloric acid, nitric acid, acetic acid and p-tolenesulfonic acid. This solution is slowly added to the polymeric solution with stirring at around 0° C. for 10 hr. At this time, the mole number of 2,3-dihydropyran may be controlled to obtain a desired ratio of protecting groups. The resulting reaction is dropwise added in distilled water to give precipitates. They are dissolved in dimethylformamide again and re-precipitated in distilled water. The procedure of dissolving in dimethylformamide and precipitating in distilled water is repeated two or three times. Then, the final precipitates are dried in a vacuum oven to obtain pure vinyl 4-tetrahydropyranyloxybenzal-vinyl 4-hydroxybenzal-vinyl tetrahydropyranyl ether-vinyl acetate copolymer or vinyl 4-tetrahydropyranyloxybenzal-vinyl tetrahydropyranyl ether-vinyl acetate copolymer.

Depending on the ratio of the functional groups contained, the copolymers have characteristic properties. Hence, the functional groups must be present at an amount within a certain range in order for the copolymers to be used as photoresists. In accordance with the present invention, 4-tetrahydropyranyloxybenzal group is preferably present at an amount of 5-70 mole % in the vinyl 4-tetrahydropyranyloxybenzal-vinyl tetrahydropyranylether-vinyl acetate copolymer. For example, if 4-tetrahydropyranyloxybenzal group is present at an amount less than 5 mole %, the vinyl 4-tetrahydropyranyloxybenzal-vinyl tetrahydropyranylether-vinyl acetate copolymer cannot practically be used because deficient protection cannot give a significant solubility difference in a developing solution. On the other hand, if 4-tetrahydropyranyloxybenzal group over 70 mole % is present, the copolymer is poor in adhesion to the substrate. Also, it is preferred that tetrahydropyranylether is present at an amount of 1-60 mole % in the vinyl 4-tetrahydropyranyloxybenzal-vinyl tetrahydropyranyl ether-vinyl acetate copolymer. More than 60 mole % of hydroxy group decreases the solubility of the copolymer in solvent, resulting in poor development. For the acetate group, the presence at an amount more than 40 mole % significantly decreases the glass transition temperature of the copolymer. Thus, acetate group is preferably present at an amount of 0-40 mole % in the copolymer.

In accordance with an aspect of the present invention, a vinyl 4-tetrahydropyranyloxybenzal-vinyl tetrahydropyranyl ether-vinyl acetate copolymer is provided and represented by the following general formula I:

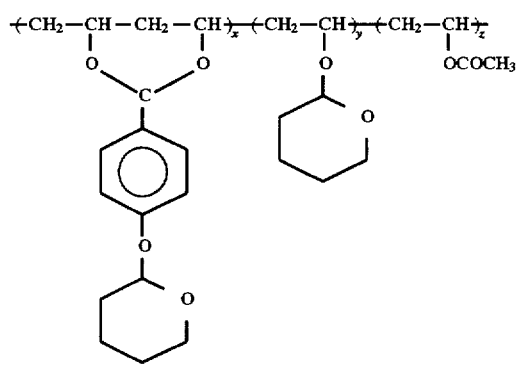

wherein x is a mole percent ranging from 5 to 70;

y is a mole percent ranging from 1 to 60; and z is a mole percent ranging from 0 to 40.

The copolymer chain of formula I shows regular or irregular sequences.

In the vinyl 4-tetrahydropyranyloxybenzal-vinyl 4-hydroxybenzal-vinyl tetrahydropyranyl ether-vinyl acetate copolymer according to the present invention, the vinyl 4-hydroxybenzal groups of vinyl 4-hydroxybenzal-vinyl alcohol-vinyl acetate copolymer partly remain unprotected. Such unprotected acetal structure brings about effects of enhancing mechanical strength, increasing glass transition temperature, and intensifying sensitivity by virtue of the remaining phenol. Because an appropriate solubility difference in a developing solution comes from deprotection of the vinyl 4-tetrahydropyranyl oxybezal group, the vinyl 4-hydroxybenzal group unprotected does not exceed 50 mole %. Therefore, in accordance with another aspect of the present invention, a vinyl 4-tetrahydropyranyloxybenzal-vinyl 4-hydroxybenzal-vinyl tetrahydropyranyl ether-vinyl acetate copolymer is provided and represented by the following general formula II:

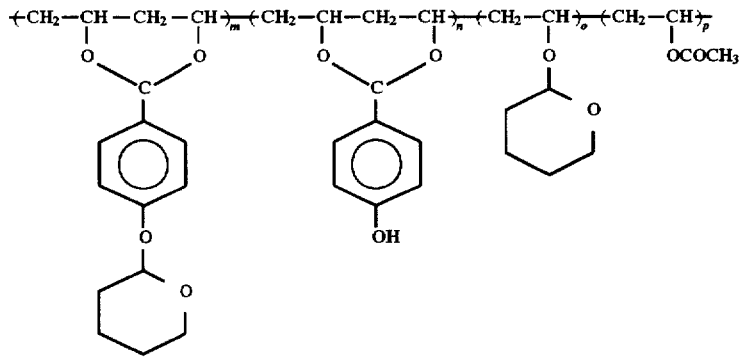

wherein m is a mole percent ranging from 1 to 50;

n is a mole percent ranging from 5 to 60;

o is a mole percent ranging from 1 to 60; and p is a mole percent ranging from 0 to 40.

A better understanding of the present invention may be obtained in the following examples which should not to be considered as limitations on the present invention.

EXAMPLE I

Preparation of Copolymer III

In a 250 mL four-neck flask equipped with a calcium tube, a dropping, ainlet nitrogen gas conduit and a thermometer, 100 mL of dimethylformamide (DMF) and 5 g of poly (vinylalcohol) (80% hydrolyzed, average molecular weight 9,000–10,000) were added and completely dissolved by stirring at 50° C. for 5 hr, after which 3 mL of 36% hydrochloric acid solution was added. Then, using the dropping funnel, a solution of 3 g of 4-hydroxybenzaldehyde in 50 mL of dimethylformamide 3 g of 4-hydroxybenzaldehyde was dropwise added into the flask for 1 hr with stirring at room temperature. After completion of the addition, the reaction mixture were stirred for 1 hr. The product thus obtained was slowly added through a funnel in 800 mL of distilled water in a beaker with stirring. Precipitates produced were dried in vacuum oven for 24 hrs. The dried precipitates were dissolved in dimethylformamide again and re-precipitated in distilled water. After the disolution and re-precipitation procedure was repeated twice, the final precipitates were dried in a vacuum oven to give pure copolymer III. Yield 80%.

The synthesis of the vinyl 4-hydroxybenzal-vinyl alcohol-vinyl acetate copolymer was confirmed by NMR and IR spectrum analyses. The NMR spectra showed that the mole ratio of 4-hydroxybenzal:alcohol:acetate in the copolymer was 37:49:14.

EXAMPLE II

Preparation of Copolymer I

In a four-neck flask equipped with a thermometer, a calcium tube and a nitrogen gas inlet, 5 g of copolymer III obtained in Example I was dissolved in 100 mL of dimethylformamide. The solution was cooled to 0° C. by use of ice. Separately, 30 g of 2, 3-dihydropyran was dissolved in 50 mL of dimethylformamide and added with 1 mL of 36% hydrochloric acid. This solution was slowly added in the flask containing the copolymer III solution. Stirring was continued for 10 hr at 0° C. After terminating the reaction, a product was obtained as precipitates in distilled water. They were dissolved in dimethylformamide again and re-precipitated in distilled water. These dissolving and precipitating steps were carried out several times. The resulting precipitates were dried in a vacuum oven for 24 hrs to give pure copolymer I. The yield was 85%.

The synthesis of vinyl 4-tetrahydropyranyloxybenzal-vinyl tetrahydropyranyl ether-vinyl acetate copolymer was confirmed by the following NMR and IR spectra. The NMR spectra showed that the mole ratio of vinyl 4-tetrahydropyranyloxybenzal:vinyl tetrahydropyranyl ether:vinyl acetate in the copolymer was 37:49:14.

$^1$H-NMR (200 MHz, DMSO-$\delta$6) $\delta$9.35(s, Ph-OH), 6.98–7.35(m, Ph-H), 5.46(s, —O—CH—O—), 4.6(br, —O—CH—O—), 1.62–2.08(m, Ph-pyran —CH$_2$—), 1.5–1.92(m, pyran —CH$_2$—)

IR (NaCl) cm$^{-1}$:2942, 1029, 970

EXAMPLE III

Preparation of Copolymer II (1)

In a four-neck flask equipped with a thermometer, a calcium tube and a nitrogen gas inlet, 5 g of copolymer III obtained in Example I was dissolved in 100 mL of dimethylformamide. The solution was cooled to 0° C. in an ice bath. Separately, 15 g of 2, 3-dihydropyran was dissolved in 50 mL of dimethylformamide and then 1 mL of 36% hydrochloric acid was added. This solution was slowly added to the flask containing the copolymer III solution. Stirring was continued for 10 hrs at 0° C. After terminating the reaction, a product was obtained as precipitates in distilled water. They were dissolved in dimethylformamide again and re-precipitated in distilled water. These dissolving and precipitating steps were carried out several times. The resulting precipitates were dried in a vacuum oven for 24 hrs to give pure copolymer II. The yield was 90%.

The synthesis of vinyl 4-tetrahydropyranyloxybenzal-vinyl 4-hydroxybenzal-vinyl tetrahydropyranyl ether-vinyl acetate copolymer was confirmed by NMR and IR spectrum analyses. The NMR spectra showed that the mole ratio of vinyl 4-tetrahydropyranyloxybenzal:vinyl 4-hydroxybenzal:vinyl tetrahydropyranylether:vinyl acetate in the copolymer was 3:33:50:14.

EXAMPLE IV

Preparation of Copolymer II (2)

In a four-neck flask equipped with a thermometer, a calcium tube and a nitrogen gas inlet, 5 g of copolymer III obtained in Example I was dissolved in 100 mL of dimethylformamide. The solution was cooled to 0° C. in an ice bath. Separately, 20.7 g of 2,3-dihydropyran was dissolved in 50 mL of dimethylformamide and then 1 mL of 36% hydrochloric acid was added. This solution was slowly added to the flask containing the copolymer III solution. Stirring was continued for 10 hrs at 0° C. After terminating the reaction, a product was obtained as precipitates in distilled water. They were dissolved in dimethylformamide again and re-precipitated in distilled water. These dissolving and precipitating steps were carried out several times. The resulting precipitates were dried in a vacuum oven for 24 hrs to give pure copolymer II. The yield was 90%.

The synthesis of vinyl 4-tetrahydropyranyloxybenzal-vinyl 4-hydroxybenzal-vinyl tetrahydropyranyl ether-vinyl acetate copolymer was confirmed by NMR and IR spectrum analyses. The NMR spectra showed that the mole ratio of vinyl 4-tetrahydropyranyloxybenzal:vinyl 4-hydroxybenzal:vinyl tetrahydropyranylether:vinyl acetate in the copolymer was 13:24:48:15.

EXAMPLE V

Preparation of Vinyl 4-hydroxybenzal-Vinyl tetrahydropyranylether-Vinyl acetate copolymer In a four-neck flask equipped with a thermometer, a calcium tube and a nitrogen gas inlet, 5 g of copolymer III obtained in Example I was dissolved in 100 mL of dimethylformamide. The solution was cooled to 0° C. in an ice bath. Separately, 10 g of 2, 3-dihydropyran was dissolved in 50 mL of dimethylformamide and then 1 mL of 36% hydrochloric acid was added. This solution was slowly added to the flask containing the copolymer III solution. Stirring was continued for 10 hrs at 0° C. After terminating the reaction, a product was obtained as precipitates in distilled water. They were dissolved in dimethylformamide again and re-precipitated in distilled water. These dissolving and precipitating steps were carried out several times. The resulting precipitates were dried in a vacuum oven for 24 hrs to give pure vinyl 4-hydroxybenzal-vinyl tetrahydropyranyl ether-vinyl acetate copolymer.

The data of NMR and IR spectra indicates that tetrahydropyranyl group was only substituted for vinyl alcohol. The NMR spectra showed that the mole ratio of vinyl 4-hydroxybenzal:vinyl tetrahydropyranyl ether:vinyl acetate in the copolymer was 38:50:12.

EXAMPLE VI

Preparation of Photoresist using Copolymer I

Copolymer I with mole ratio 37:49:14 of vinyl 4-tetrahydropyranyloxybenzal:vinyl tetrahydropyranyl ether:vinyl acetate, obtained in Example II, was dissolved in 2-ethoxyethanol to produce a 20 wt % solution which was, then, added with triphenylsulfonium hexafluoroantimonate at an amount of 8 wt % based on the weight of the copolymer, to give a resist solution. It was filtered by passing through 2 micron filter. The filtrate was spin-coated on a silicon wafer at a 3000 rpm for 30 second, to form a film 1 micron thick. The film was prebaked on a hot plate at 110° C. for 120 seconds and then, exposed to 254 nm beam at an amount of 18 mJ/cm$^2$ under a mask. For the post-exposure bake, the wafer was placed on a hot plate at 80° C. for 90 seconds. At that moment, a latent image appeared. After the resist was developed by immersing in 2.38 wt % tetramethylammoniumhydroxide solution for 90 seconds, a patten of line/space 2 micron wide was formed as determined by an optical microscope.

EXAMPLE VII

Preparation of Photoresist using Copolymer II

Copolymer II with mole ratio 13:24:48:15 of vinyl 4-tetrahydropyranyloxybenzal:vinyl hydroxybenzal:vinyl tetrahydropyranyl ether:vinyl acetate, obtained in Example VI, was dissolved in 2-ethoxyethanol to produce a 20 wt % solution which was, then, added with triphenylsulfonium hexafluoroantimonate at an amount of 8 wt % based on the weight of the copolymer, to give a resist solution. It was filtered by passing through 2 micron filter. The filtrate was spin-coated on a silicon wafer at a 3500 rpm for 60 seconds, to form a film 1 micron thick. The film was prebaked on a hot plate at 110° C. for 120 seconds and then, exposed to 254 nm beam at an amount of 15 mJ/cm$^2$ under a mask. For post-exposure bake, the wafer was placed on a hot plate at 70° C. for 90 seconds. At that moment, a latent image appeared. After the resist was developed by being immersed in 2.38 wt % tetramethylammoniumhydroxide solution for 90 seconds, a patten of line/space 2 micron wide was formed as determined by an optical microscope.

EXAMPLE VIII

Optical Absorbance at 254 nm of Copolymer II

Copolymer with mole ratio 13:24:48:15 of vinyl 4-tetrahydropyranyloxybenzal:vinyl hydroxy benzal:vinyl tetrahydropyranyl ether:vinyl acetate, obtained in Example IV, was dissolved in 2-ethoxyethanol to give a 20 wt % solution. It was spin-coated on a quartz plate to form a film 1 micron thick which was, then, subjected to UV spectrum analysis. Separately, triphenylsulfonium hexafluoroantimonate was added to the solution at an amount of 8 wt % based on the weight of the copolymer, to give a resist solution which was subsequently spin-coated on a UV quartz plate. This coating was prebaked at 120° C. for 3 min, from which a UV spectrum was obtained. For another UV spectrum, the prebaked coating was exposed to 254 nm beam at an energy of 18 mJ/cm$^2$ by use of a stepper. A further UV spectrum was obtained after the coating was subjected to post-exposure bake at 80° C. for 90 seconds. The copolymer alone was found to have a UV absorbance of 0.095 at 254 nm as expected. After the addition of the photoacid generator at 8 wt %, the resist showed an increased optical absorbance of 0.354 owing to the aromatic group of the photoacid generator. Light illumination did not induce a drastic change in optical absorbance of the resist (0.370). However, the post-exposure bake significantly increased the optical absorbance to 0.665. From the comparison of these UV spectra, it is apparent that the copolymer itself shows high transparency at 254 nm.

EXAMPLE IX

Thermal Properties of Copolymers.

The thermal properties of the copolymers prepared in Examples II to V were determined by DSC and TGA.

Through DSC analysis with a temperature elevation rate of 20° C./min, the glass transition temperatures of the copolymers were obtained.

For TGA, photoresists were obtained by dissolving the copolymers each in 2-ethoxyethanol to give a 20 wt % solution, and adding with a 8 wt % triphenylsulfonium hexafluoroantimonate. TGA data obtained from pre-exposure photoresist were compared with those from post-exposure photoresist. Upon exposure, the energy of the light was 18 mJ/cm$^2$. As in DSC, the heat elevation rate was 20° C./min in a nitrogen atmosphere.

The glass transition temperatures of vinyl 4-hydroxybenzal-vinyl tetrahydropyranyl ether-vinyl acetate copolymer, copolymer II with mole ratio 13:24:48:15 of vinyl 4-tetrahydropyranyloxybenzal:vinylhydroxybenzal:vinyl tetrahydropyranyl ether:vinyl acetate, and vinyl 4-tetrahydropyranyloxybenzal -vinyl tetrahydropyranylether-vinyl acetate copolymer were 115° C., 90° C. and 70° C., respectively, as determined by DSC. This demonstrates that the glass transition temperature is lower as the copolymer is protected by more tetrahydropyranyl groups. Another experiment showed that the glass transition temperature was generally higher when the copolymer was protected by the tetrahydropyranyl group than by the t-butoxycarbonyl group.

To investigate the release temperature of the protecting group, a TGA analysis was made for photoresists prepared by dissolving copolymer II with a mole ratio 13:24:48:15 of vinyl 4-tetrahydropyranyloxybenzal:vinyl hydroxybenzal:vinyl tetrahydropyranylether:vinyl acetate and triphenylsulfonium hexafluoroantimonate at a weight ratio of 100:5 in dimethylformamide. After being spin-coated on a silicon wafer, they were treated under the same conditions until pre-baking. The tetrahydropyranyl group in unexposed photoresist was released at 240° C. whereas that in exposed photoresist started to be released at 60° C. Before exposure, in other words, when no acid is present, release occurs at 240° C., allowing the copolymer to be prebaked at a higher temperature than 90° C., the glass transition temperature of the copolymer. In addition, another advantage is that the remaining solvent can be removed completely. After exposure, when acid is generated, the release temperature is 60 ° C. Accordingly, there is a very large difference between post-exposure release temperature and pre-exposure release temperature, enhancing the process window.

Taken together, the thermal data demonstrated that the copolymer of the present invention is superior in thermal properties.

As described hereinbefore, the novel copolymers of the present invention widen the chance of selecting photoresist materials. In addition, when being utilized in microlithography, the photoresist made of the novel copolymer can result in much better microcircuits by virtue of superior transparency, thermal stability and dry etch resistance.

Because the release temperature, when no acid is present, is much higher than the glass transition temperature of the copolymer, unnecessary acid diffusion can be avoided by the annealing effect. The large difference in release temperature between when acid is generated by exposure and when no acid is present greatly contributes to the process window.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced in ways other those as specifically described.

What is claimed is:

1. A vinyl 4-tetrahydropyranyloxybenzal-vinyl tetrahydropyranyl ether-vinyl acetate copolymer, having regular or irregular sequences in each chains, represented by the following general formula I:

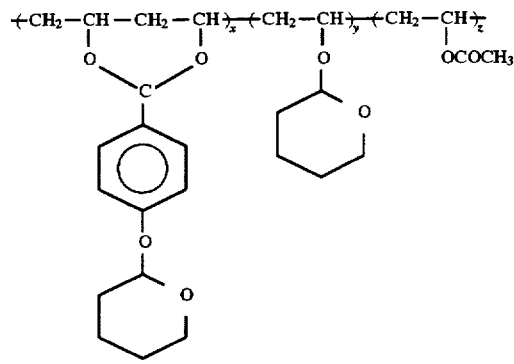

wherein x is a mole percent ranging from 5 to 70;

y is a mole percent ranging from 1 to 60; and z is a mole percent ranging from 0 to 40.

2. A vinyl 4-tetrahydropyranyloxybenzal-vinyl 4-hydroxybenzal-vinyl tetrahydropyranyl ether-vinyl acetate copolymer, having regular or irregular sequences in each chains, represented by the following general formula II:

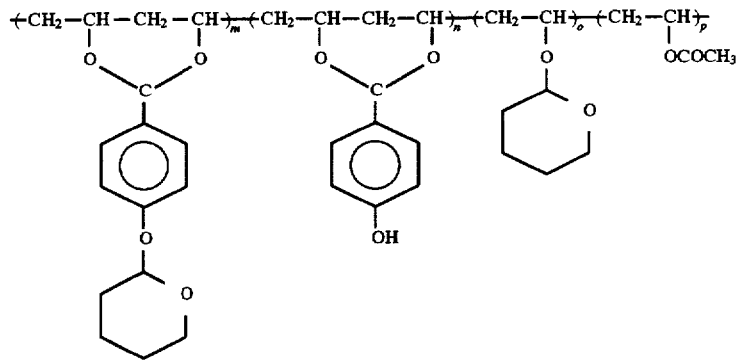

wherein m is a mole percent ranging from 1 to 50;

n is a mole percent ranging from 5 to 60;

o is a mole percent ranging from 1 to 60; and p is a mole percent ranging from 0 to 40.

* * * * *